United States Patent
Rimai et al.

(10) Patent No.: US 6,297,138 B1
(45) Date of Patent: *Oct. 2, 2001

(54) METHOD OF DEPOSITING A METAL FILM ONTO MOS SENSORS

(75) Inventors: Lajos Rimai, Ann Arbor; Amer Mohammad Khaled Samman, Dearborn; Samuel Admassu Gebremariam, Detroit, all of MI (US)

(73) Assignee: Ford Global Technologies, Inc., Dearborn, MI (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,607

(22) Filed: Jan. 12, 1998

(51) Int. Cl.$^7$ .................................................. H01L 21/44
(52) U.S. Cl. ........................... 438/597; 438/685; 438/686
(58) Field of Search .................................. 438/597, 685, 438/686

(56) References Cited

U.S. PATENT DOCUMENTS

| | | |
|---|---|---|
| 4,058,368 | 11/1977 | Svensson et al. . |
| 4,238,758 | 12/1980 | Suzuki . |
| 4,931,851 | 6/1990 | Sibbald et al. . |
| 5,140,393 | 8/1992 | Hijikihigawa et al. . |
| 5,173,441 * | 12/1992 | Yu et al. ............................ 438/676 |
| 5,342,701 | 8/1994 | Miremadi et al. . |
| 5,406,906 | 4/1995 | Rimai et al. . |
| 5,483,037 * | 1/1996 | Mashburn ........................ 219/121.68 |
| 5,534,071 | 7/1996 | Varshney et al. . |
| 5,599,584 | 2/1997 | Champney, Jr. . |
| 5,683,601 * | 11/1997 | Tatah ................................ 219/121.85 |
| 5,779,802 * | 7/1998 | Borghs et al. ................. 118/723 MP |
| 5,820,948 * | 10/1998 | Itozaki et al. ......................... 427/596 |

OTHER PUBLICATIONS

"Epitaxial Pt(001), Pt(110), and Pt(111) Films On MgO(001), MgO(110), MgO(111), and Al$_2$O$_3$ (0001)", by B.M. Lairson et al, Appl. Phys. Lett., vol. 61, No. 12, 21.

"Pulsed Laser Deposition of Heteroepitaxial Thin Pt Films on MgO(100)", by J.F.M. Cillessen et al, Thin Solid Films, 226 (1993) 53–58.

"Formation of Epitaxial and Textured Platinum Film on Ceramics– (100) MgO Single Crystals by Pulsed Laser Deposition", by J. Narayan et al, Appl. Phys. Lett. 64.

"Gas Sensitive Field Effect Devices for High Temperatures", by A. Baranzahi et al, Sensors and Actuators B 26–27 (1995) 165–169.

* cited by examiner

*Primary Examiner*—Carl Whitehead, Jr.
*Assistant Examiner*—Toniae M. Thomas
(74) *Attorney, Agent, or Firm*—Jennifer M. Stec

(57) ABSTRACT

A method for depositing a metal film onto the semiconductor substrate and insulator of a MOS sensor is provided. The method utilizes a laser ablation technique to deposit metal films having a desired thickness and roughness to enhance the reliability and sensitivity of a MOS sensor to combustible gases.

17 Claims, 12 Drawing Sheets

(a)

(b)

METHOD OF DEPOSITING A METAL FILM ONTO MOS SENSORS

TECHNICAL FIELD

This invention relates to a method of increasing the sensitivity and reliability of metal-oxide semiconductor (MOS) sensor structures with the use of a pulsed laser technique to deposit the ohmic metal back contact onto the semiconductor substrate and the metal gate onto the insulating layer of the MOS sensor structure.

BACKGROUND ART

MOS combustible gas sensors operate by catalytic oxidation of combustible gases. Substantial efforts have been expended in recent years towards the development of combustible gas sensors using semiconductor MOS technology.

Generally the MOS gas sensor consists of a semiconductor substrate with an ohmic contact on one side and with the other side covered by an insulating layer with a metal gate on top. The metal gate is composed of a metal capable of catalyzing the oxidation of combustible gases. As a result of catalytic redox reactions on the gate surface, certain atomic or molecular species are generated which can diffuse through the porous gate to the metal gate/insulator interface where they can ionize. These ions can penetrate through the insulator thereby changing the potential distribution across the device. This changes the potential of the insulator/semiconductor interface and thus the depletion layer inside the semiconductor which in turn shifts the voltage dependent admittance characteristic of the device.

A significant problem with such existing MOS gas sensors involves how to achieve deposition of a good quality metal contact on the back side of the semiconductor substrate and a catalytically effective and reliable metal gate. It has become apparent that existing deposition processes cannot achieve the necessary adherence required for reliable sensor performance. Previously used techniques, such as plasma sputtering or electron beam evaporation have produced unstable contacts due to a lack of sufficient adherence between the deposited metal and the insulator.

Prior art sensor structures, such as the structure disclosed by A. Baranzahi et al in Transducers 95 and Eurosensors IX, Vol. 1, Stockholm 1995, pp 74–44, attempted to solve the problem of adherence by depositing a buffer layer of another metal between the semiconductor substrate and the metal to be deposited thereon, for example titanium or tantalum. However, the presence of such metal buffer layers between the gate and insulator can affect the catalytic activity of the gate. In fact, during high temperatures, the buffer layer often diffuses into the metal gate, poisoning the catalyst, and thereby reducing the catalytic activity of the metal gate. High temperature operation is an inherent necessity for catalytic detection of hydrocarbons. There is thus a significant need for metal deposition methods that improve the adherence of the films to their substrates without the addition of buffer layers.

SUMMARY OF THE INVENTION

The present invention provides a method of depositing adherent metal films on the semiconductor substrate and the insulator layer of a MOS sensor device. The process includes creating a high vacuum environment in a deposition chamber equipped with a window to allow a pulsed laser beam to enter the deposition chamber. The method further includes the step of adjusting the energy of the laser beam and the position of the focus of the laser beam in the vicinity of a first target to have a fluence capable of depositing a metal film with a desired growth rate and roughness. Pursuant to the method the separation between the first target and the semiconductor substrate is further adjusted to deposit a metal film having the desired growth rate and roughness. The method also includes the step of adjusting the repetition rate and the deposition time of the laser beam to obtain a film with the desired thickness. Following these adjustments, a metal film is deposited onto the semiconductor substrate of the sensor by laser ablation of the first target. The semiconductor substrate is then rotated to permit deposition onto the insulator layer and the first target is exchanged with a second target. Lastly, a metal film is deposited onto the insulator layer of the sensor by laser ablation of the second target.

The laser deposition, being carried out in a high vacuum environment and with high impact energies, creates rough metal/insulator and metal/semiconductor interfaces which improve adhesion. In addition, this deposition method produces a rough outside surface of the gate electrode enhancing considerably its effective surface area for catalytic reactions which thus increases the sensitivity of the sensor.

BEST MODE FOR CARRYING OUT THE INVENTION

Figure 1:
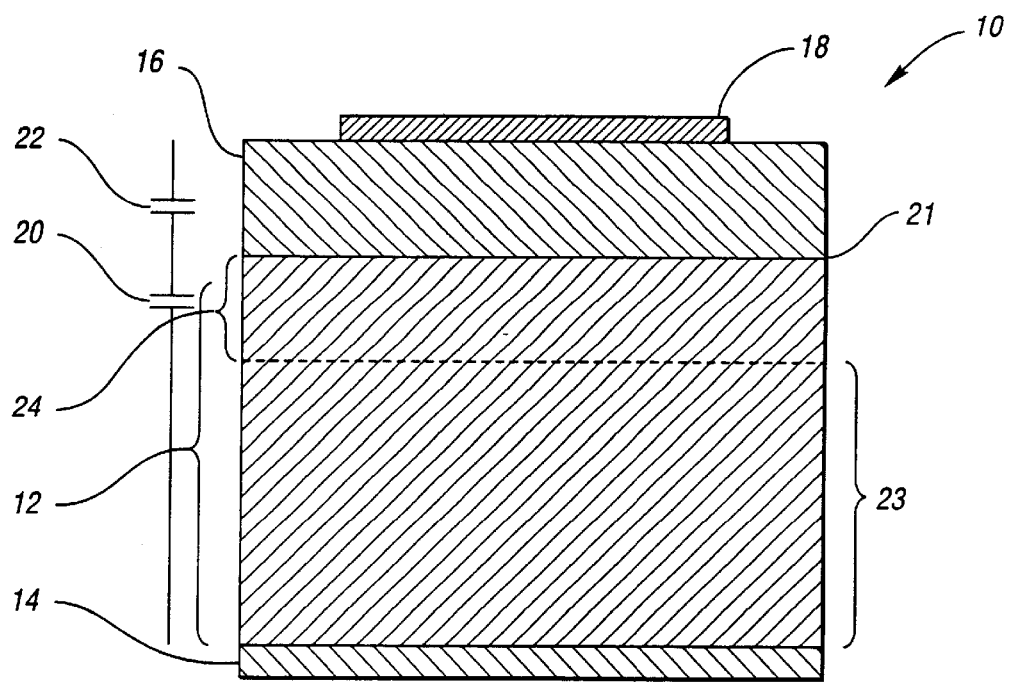
FIG. 1 illustrates a simple model of a metal oxide semiconductor structure.

A simple model for a MOS structure 10 is shown schematically in FIG. 1. The sensor structure 10 includes a semiconductor 12, a metal back contact 14, an insulator layer 16, and a metal gate 18. For high temperature applications, the preferred semiconductor is SiC, due to its ability to operate at temperatures exceeding 800° C. necessary for achieving catalytic oxidation-reduction of hydrocarbons as well as CO. It has also been shown that SiC-based MOS sensors detect with reasonable speed composition changes in the exhaust of an automobile engine. The metal back contact 14 is preferably made of tantalum, titanium or nickel with an outside layer of Pt to prevent high temperature oxidation. Laser ablated Pt film on SiC by itself will also make an acceptable ohmic metal back contact at these high temperatures. The insulator layer 16 is preferably $SiO_2$ or $Si_4N_3$ and the metal gate 18 is preferably composed of platinum, palladium, rhodium, alloys thereof or any metal that exhibits good catalytic activity.

To a first approximation, the MOS structure 10 can be represented by two capacitors 20,22 connected in series, as shown in FIG. 1. The total capacitance $C_T$ of the structure 10 will be a function of a gate voltage, applied to the structure. The oxide capacitance $C_O$, 22 between the metal gate 18 and the semiconductor 12, in the ideal case, insures that no DC current flows through the sensor structure 10. The depletion layer capacitance, C, 20 represents the capacitance between the semiconductor/insulator interface 21 and the bulk of the semiconductor 23. The depletion layer 24 forms in the semiconductor upon application of a negative gate voltage for n type semiconductors.

For a perfectly insulating oxide, even with a DC voltage V applied, the system will be in equilibrium, as no current can flow through it, which means that the Fermi level must be constant throughout the system. Because work functions of the metal back contact 14 and the semiconductor 12 are different there will be an equilibrium voltage shift between the depletion layer 24 and the bulk of the semiconductor 23. As the carriers in the semiconductor 12 are mobile this entails a non-zero charge in the depletion layer 24. In a n type semiconductor there will be carrier depletion 24 below the semiconductor/insulator interface 21 when the-gate is biased negative with respect to the bulk of the semiconductor 23. If an additional voltage V is applied between the metal gate 18 and the semiconductor bulk 23, the charge distribution within this region, which now supports an electric field, will be further modified. The potential at the semiconductor/insulator interface 21 as well as the width of the depletion region 24 change with the applied voltage.

When a MOS gas sensor 10 is operated in depletion, the depletion layer 24 in the semiconductor 12 insures open circuit (equilibrium) operating condition, and by examining the voltage dependence of the total capacitance, changes in the charge distribution through the insulating layer can be determined. If ionic charges are either injected into or withdrawn from the insulator due to catalytic redox reactions at the gate there will be shifts in the voltage dependence of the total capacitance of the total device.

At low temperatures, where prior art Si-based MOS devices had to be operated, the mobility of the injected charges was so small that except perhaps for hydrogen the device's electronic performance was too sluggish to be of use. By using a semiconductor that allows operation at sufficiently high temperatures one might expect that because of increased mobility, a well defined electrical response can be expected from such a MOS device when the oxide charge distribution is altered. Accordingly, the use of SiC-based MOS sensor devices is preferred.

For the sensor to function, the metal gate 18 should be porous to the species in the gas mixture to be detected. The appropriate species can be a stable molecular species in the gas mixture, or an intermediate generated by chemical reactions on the surface of the metal gate 18. The surface area of the metal gate 18 thus also affects the sensitivity and response speed of the device.

More specifically, the present invention teaches a method of enhancing the sensitivity and reliability of a MOS sensor device with the use of a laser ablation process for the deposition of a metal gate onto the insulator layer and the deposition of an ohmic metal back contact onto the semiconductor wafer of MOS sensor structures. Under the method of this invention, metal films are deposited on the semiconductor and insulator in a high vacuum deposition chamber with high impact energies. Experimental evidence indicates that the application of this pulsed laser deposition process is of specific importance in fabricating catalytic gate sensors, as it produces high roughness interfaces which enhance the rate of catalytic reactions responsible for the sensing mechanism. The deposition method of this invention allows direct deposition of adherent platinum and other noble metal contacts to semiconductor substrates, such as SiC and to the insulator such as $SiO_2$. The sensor response of devices prepared in this manner was comparable to that of devices made with sputtered multiple layer metal gates. Another advantage of this technique is that the entire process, from the oxidized wafers to a functioning device structure, can be performed in a high vacuum chamber.

Figure 2:
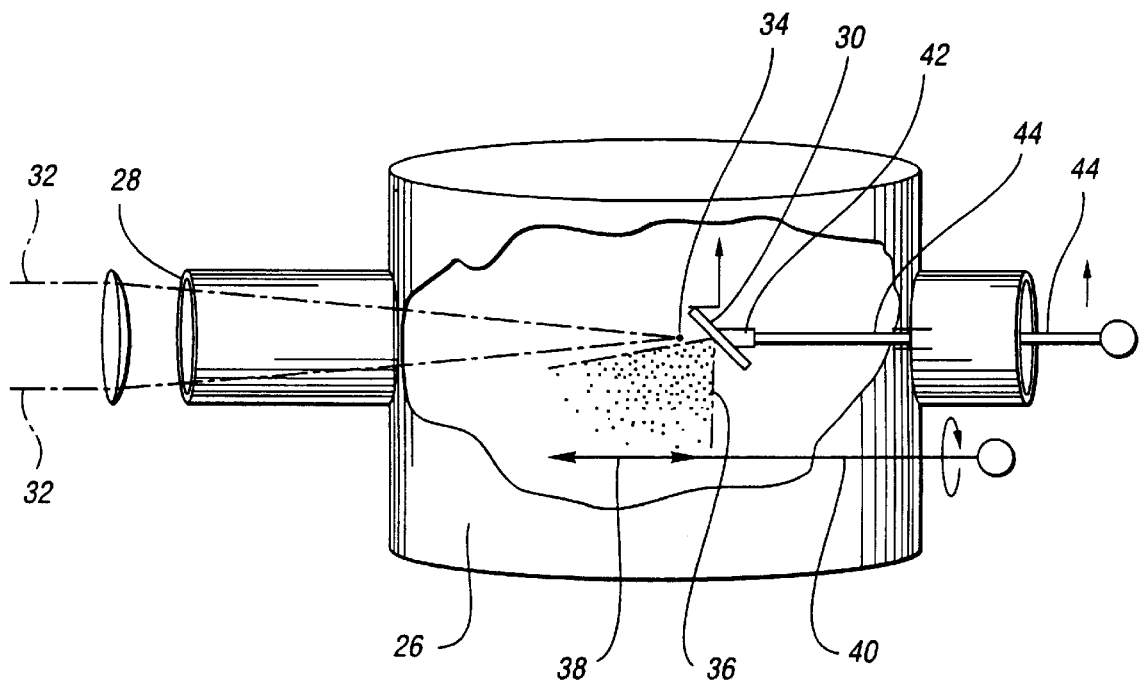
FIG. 2 illustrates an embodiment of the present method for deposition of a metal film onto a semiconductor substrate and insulator layer of a MOS sensor using laser ablation in a deposition chamber.

Accordingly, under this invention, and as depicted in FIG. 2, the deposition process includes the step of creating a high vacuum environment in a deposition chamber 26 equipped with a window 28 allowing illumination of a target 30 by pulsed laser radiation 32 the term "high vacuum" as used throughout the specification, is intended to mean pressures or less than $10^{-5}$ torr. This radiation is focused 34 in the vicinity of the front surface of the selected target 30. The impinging laser beam pulses 32 cause emission of a plume 36 of metal atoms from the target 30 which in turn impinges on the surface of the substrate 38 where it deposits a metal film to a desired thickness and having a desired roughness.

The fluence at the target, the repetition rate and the total deposition time are adjusted to obtain a metal film having the desired thickness for a given target and substrate separation. The roughness of the resulting film will depend on the fluence of the laser beam 32. The position of the focus 34 of the laser beam 32 is adjusted relative to the surface of the target 30 to obtain the appropriate fluence since the range of the energy of the laser beam is limited. In the preferred embodiment, the separation between the target and the substrate is kept smaller than the mean free path of the atomic species being transferred from the target to the substrate. Thus the kinetic energy of the atoms and molecular fragments arriving at the substrate depends solely on the fluence of the ablating radiation, as long as the fluence is kept above the vaporization/ablation threshold. Above this threshold, the deposition rate will still increase with increasing fluence, and so will the roughness of the film.

For a fixed pulse repetition rate and laser fluence at the target, the film deposition rate will increase with decreasing target to substrate separation. By controlling the fluence and repetition rate of the pulsed laser and the position of the target relative to the substrate as well as the deposition time, the roughness and thickness of the deposited metal can be separately controlled.

The process further utilizes a rotatable substrate holder frame 40 which is feasible as this deposition process does not require heating of the substrate. It should be noted that with the use of this laser ablation method, the substrate does not need to be heated either during deposition or after deposition. Without a heater, the deposition system is much less complex and devoid of the many problems associated with heating. The process also utilizes a target holder 42 which can be adjusted with adjustment means 44 to facilitate the exchange of targets within the vacuum chamber. The ability to exchange targets within the vacuum chamber allows for the creation of multi-layer films. These multi-layer films can be selectively deposited to adjust the device's sensitivity towards a particular combustible gas, such as CO.

Figure 3:
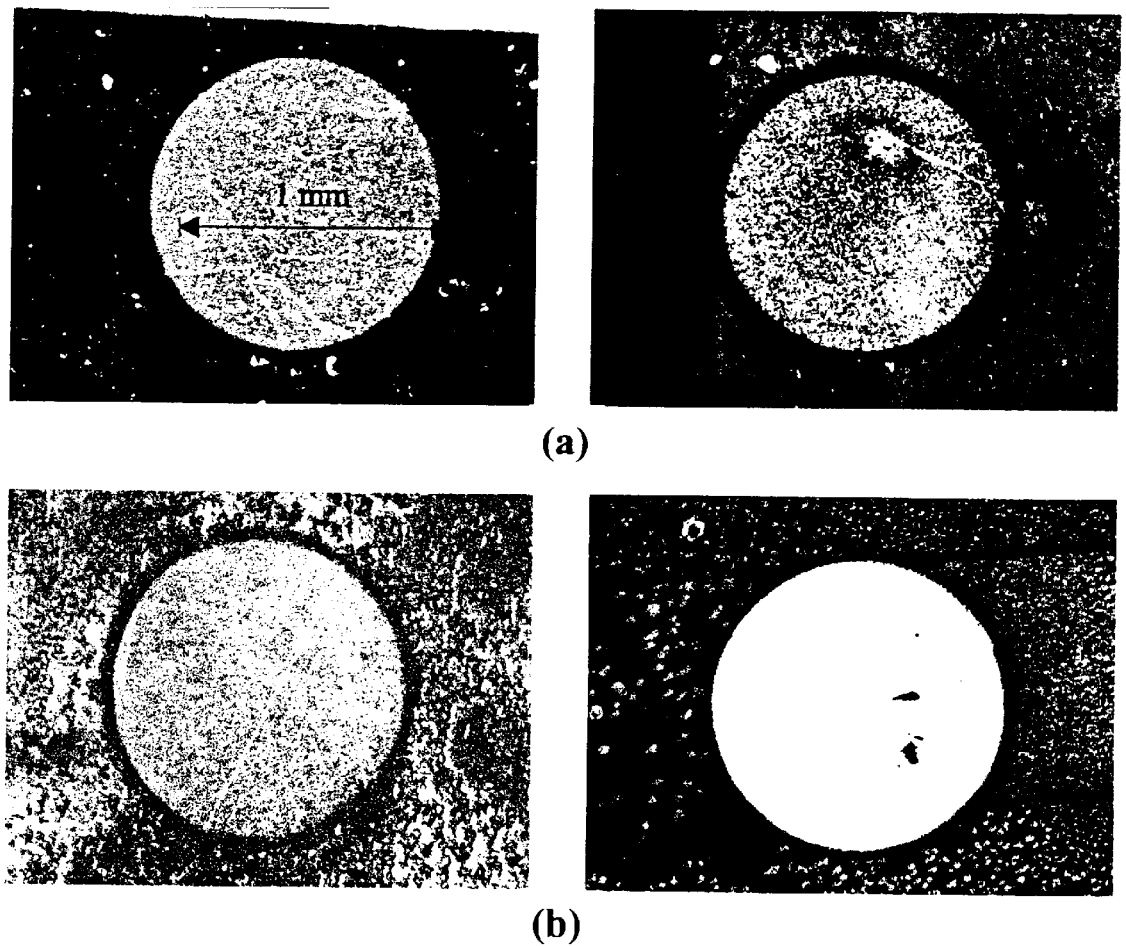
FIG. 3a is a plane view microphotograph of a MOS sensor having a platinum gate deposit by laser ablation before (left) and after (right) operation at 500° C. for a number of days.
FIG. 3b is a plane view microphotograph of a MOS sensor having a platinum gate deposited by RF sputtering onto an unheated substrate before (left) and after (right) operation at 500° C. for a number of days.

The structure of the devices fabricated in the laboratory are shown in schematic cross section in FIG. 1 and in plane view photographs (3a and b) in FIG. 3. The prepared MOS devices depicted in FIG. 3 comprise metal back contact having a 500 Å tantalum layer and a platinum layer with a thickness of 1000 Å–2000 Å deposited thereon. The prepared devices further included a 300 Å $SiO_2$ insulator and a Pt metal gate having a thickness in the range of 1000 Å–2000 Å. The SiC semiconductor substrate had an epitaxial layer 3 $\mu$m thick with the remaining substrate having a 500 Å thickness. The devices were prepared on the Si face of n-type 6H-SiC wafers with a 3 $\mu$m thick epitaxial layer with a donor concentration of $4\times10^{16}$ $cm^{3}$. The wafers were thermally oxidized to grow a ~300 Å thick $SiO_2$ layer. The back, C face oxide was removed by mechanical grinding. The wafer was ultrasonically cleaned in acetone and methanol before depositing the back and front (gate) metal contacts. For the metal back contact, Ta followed by Pt were deposited by laser ablation. The Ta target was ablated clean for over 2 minutes with 351 nm laser pulses having an approximate fluence of 2J/cm2, at a 20 Hz repetition rate with subsequent deposition for 10.5 minutes. The base pressure in the deposition chamber was $2.7\times10^{-6}$ Torr. Then the Ta target was replaced by the Pt target for a 15 minute deposition under the same conditions. No annealing was performed except what might be taking place as the device is being operated at 500° C.

The 1 mm diameter front catalytic metal gates were prepared by deposition through Ta shadow masks. The platinum deposition onto the insulator layer was performed in the same manner as described above. The thickness of these gates was near 1000 Å.

For comparison purposes a set of devices was also prepared, with the same metal back contact, but with the Pt metal gates deposited at room temperature by plasma sputtering in a DC triode system. The thickness of these front Pt metal gates was approximately 1600 Å but they where much more easily scraped off the $SiO_2$ by the contact probes than those deposited by laser ablation.

FIGS. 3a and 3b show comparisons of optical micrographs of the metal gates, before and after device operation for a number of days on a sensor at 500° C. for MOS capacitors with RF sputtered and with pulsed laser deposited Pt gates. Clearly, there is indication of some degree of microstructural change during high temperature operation for both types of devices. However, a qualitatively much more marked change is observed for the device with RF sputtered gate, which includes the appearance of holes as well as large scale inhomogeneities. In addition profilometer scans indicate that the average height of the sputtered film above the oxide doubled whereas that of the laser deposited gate remained the same, indicating that the former has undergone substantial delamination, attesting to the much better stability of the laser deposited gate.

Figure 4:
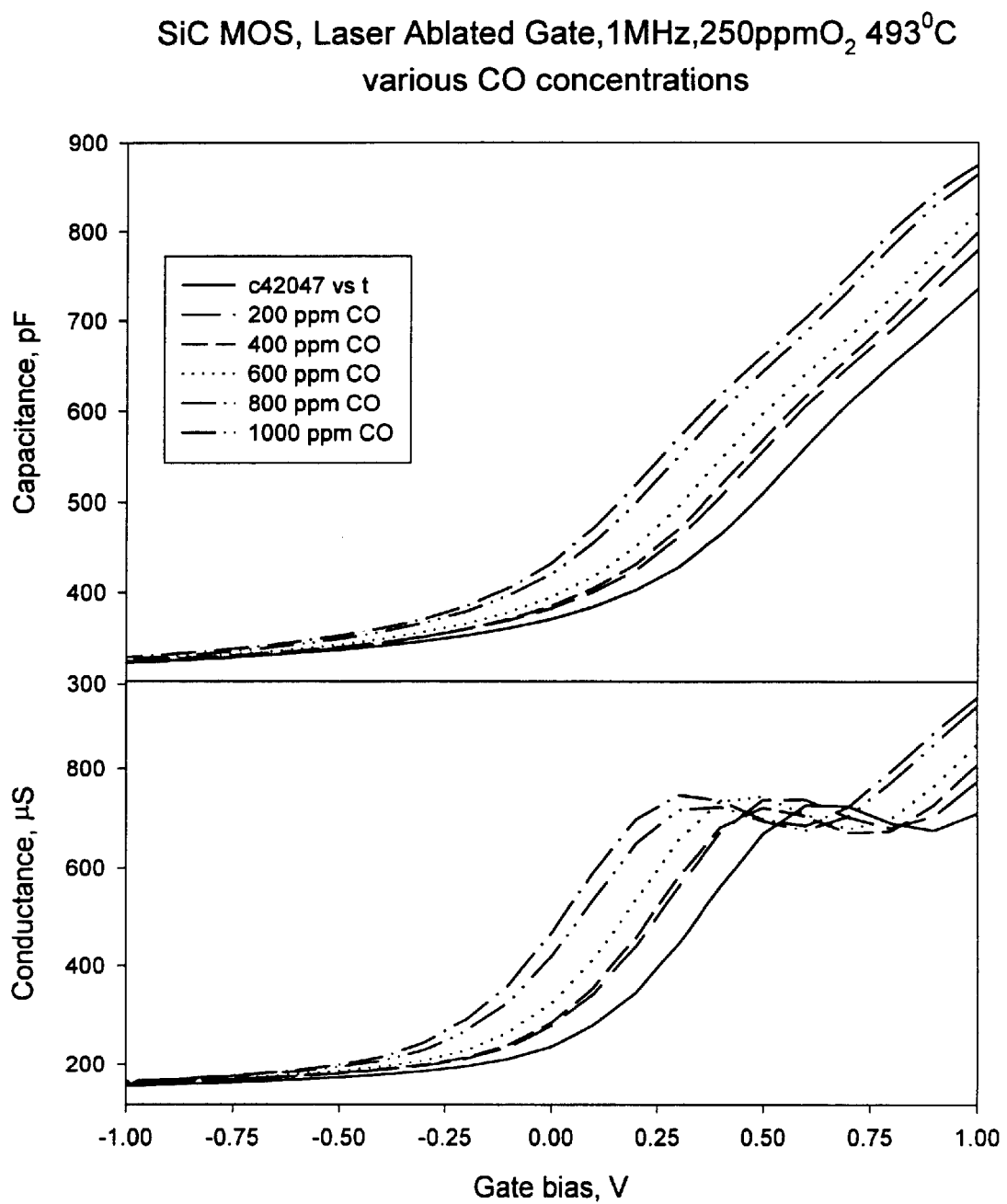
FIG. 4 is a graph illustrating the effect of CO on the gate bias dependence of the capacitance and conductance at 1 MHz of a laser ablated platinum gate MOS sensor.
Figure 5:
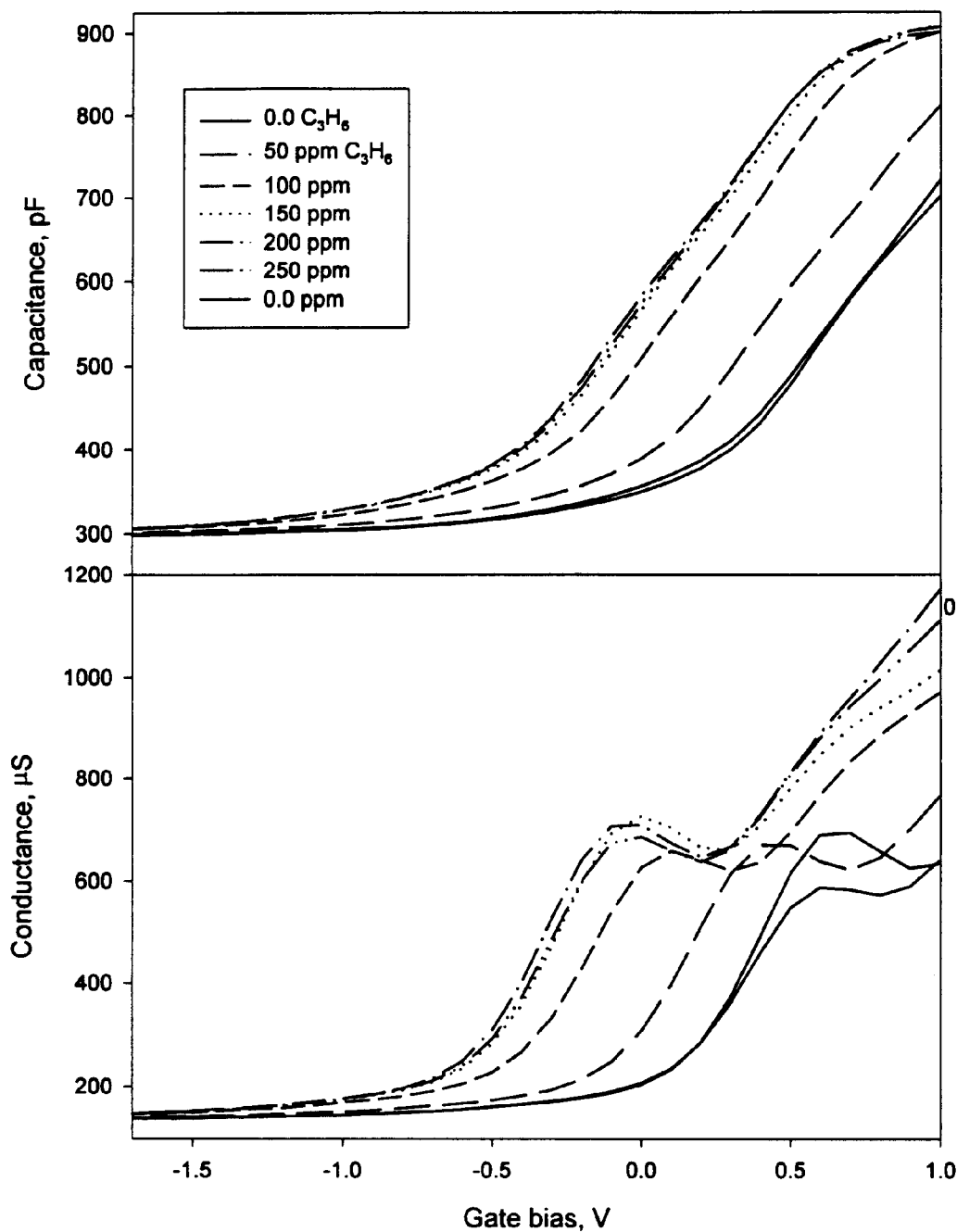
FIG. 5 is a graph illustrating the effect of propylene on the gate bias dependence of the capacitance and conductance at 1 MHz of a laser ablated platinum gate MOS sensor device.
Figure 6:
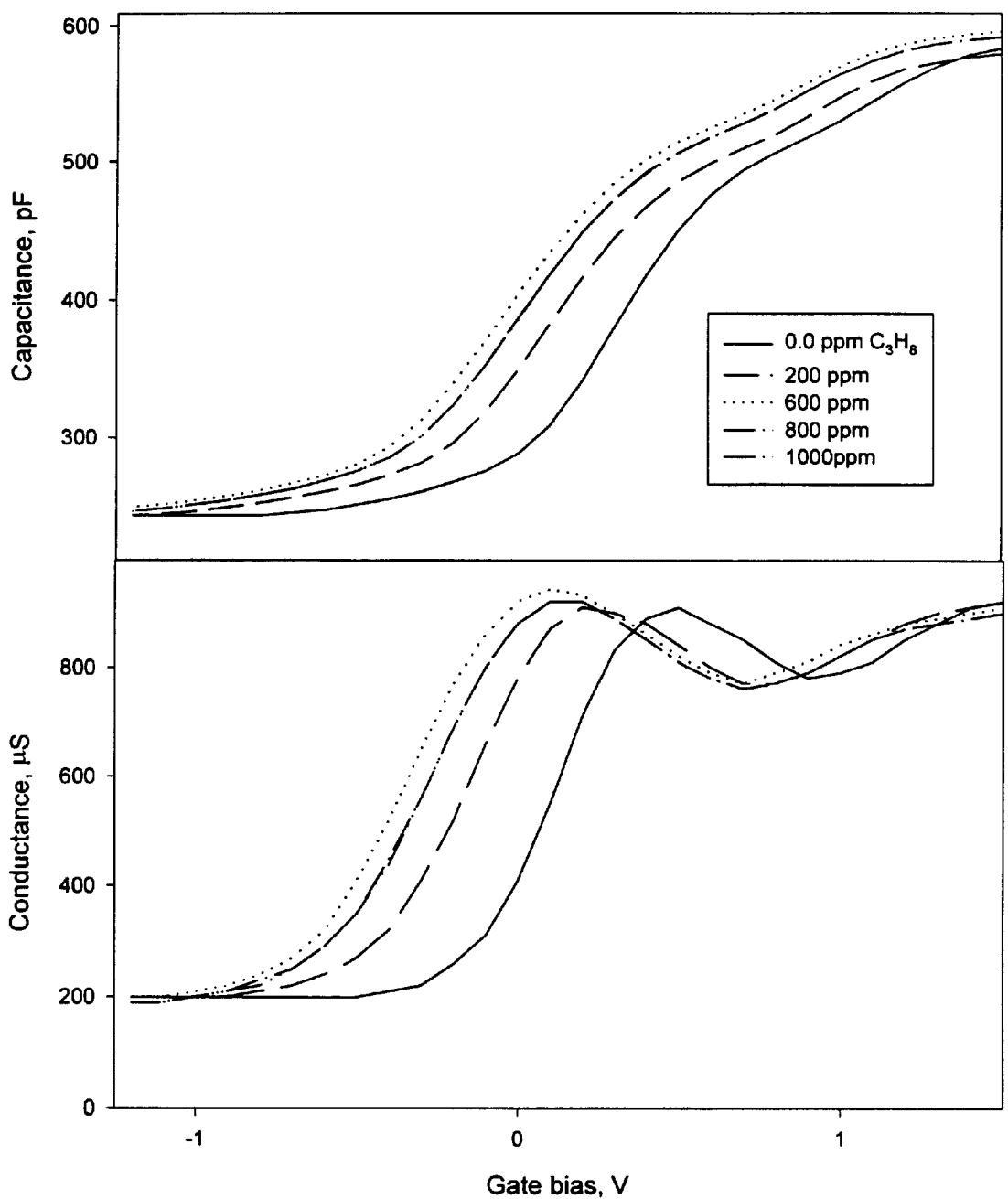
FIG. 6 is a graph illustrating the effect of propane on the gate bias dependence of the capacitance and conductance at 1 MHz of a sputtered platinum gate MOS sensor device. All profiles shown were recorded with decreasing bias.

FIGS. 4 and 5 show a set of experimental traces of small signal 1MHz A.C. device admittance (capacitance and conductance), as a function of applied bias, with one combustible concentration (CO and $C_3H_6$, respectively) as the parameter for a device with a laser ablated Pt gate. In FIG. 5, the two solid nearby superposed curves at 0.0 ppm propylene were recorded before and after the combustible concentration was varied. In contrast, FIG. 6 shows characteristics of a device with an RF sputtered Pt gate at various propane concentrations, prepared on the same water (with the same laser ablated Ta/Pt back contact) as the laser ablated gate devices (oxide thickness 300 Å). For the measurements the devices were held horizontally into a ceramic structure positioned on top of a resistive heater, inside a thermally insulated small gas flow chamber. The back contact was made through a Pt foil while a weighted Pt wire with a small sphere at the tip made contact to the gate. All measurements discussed here were performed with the device in the range of 490 to 510° C. Within this range its characteristics exhibited negligible temperature dependence. The total gas flow rate was 1000 sccm of mostly nitrogen with the oxygen and variable combustible concentrations as indicated on the graphs.

Figure 7:
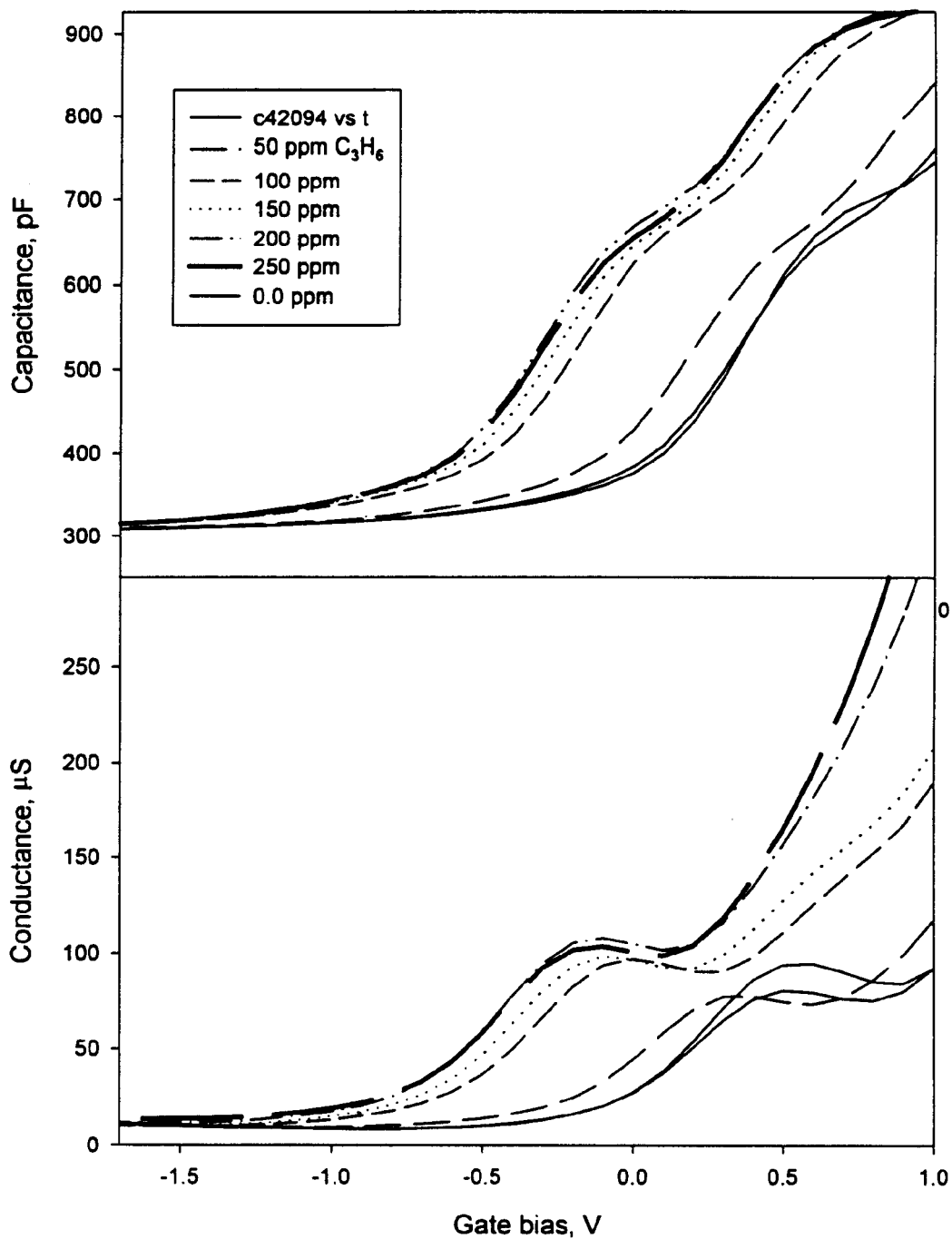
FIG. 7 is a graph illustrating the effect of propylene on the gate bias dependence of the capacitance and conductance at 100 KHz of a laser ablated platinum gate MOS sensor device.

The combustible concentration dependent shift is evident from the capacitance versus voltage traces. It should be noted that a definite response is obtained for both, the hydrocarbon and CO. The plotted capacitances were calculated for an equivalent parallel RC circuit assumed to represent the device. The lower set of curves in FIGS. 4 to 7 show the presence of a finite conductance value G=1/R even in the depletion region, a clear indication that AC losses in the device have to be accounted for in the model. A simple parallel RC circuit will not adequately represent the electrical transport processes in the device. In FIG. 7, the two solid nearby superposed curves at 0.0 ppm propylene were recorded before and after the combustible concentration was varied.

The capacitance profile is frequency dependent, as shown by comparing the 1MHz and 100KHz data of FIGS. 5 and 7. The data show the horizontal shift of the capacitance curve with changes in combustible concentration. The peak in the conductance G (which occurs near the flat band region) shifts rigidly with the capacitance curve. Also, at fixed gas composition, its height increases monotonically with measurement frequency together with a concomitant shift of the corresponding bias, in a manner not inconsistent with the presence of carrier traps in the semiconductor in the vicinity of the oxide interface. The marked increase of the background loss as we move from depletion to accumulation seems likely to be due to losses, either in the oxide, or in a series resistance.

Reproducible high frequency C(V) curves can be obtained for these devices, in the temperature range of 250 to 550° C., down to frequencies as low as 50 KHz as long as the bias remains within a relatively controlled range, in particular, by remaining slightly shy of full accumulation. Below 60 KHz the bias range where stable characteristics can be obtained becomes rather small. This might be related to losses in the oxide, due either to motion of massive carriers such as oxygen vacancies for example or to electronic conduction under breakdown.

There are two modes of operation, based on capacitance measurements, that can be considered in sensor applications for such devices. The simplest involves the recording of capacitance variation at a constant applied gate bias, as a function of the changes in gas composition. The second method uses a feedback loop where the gate bias is adjusted to keep the measured capacitance at a specified value. The output signal then is given by the changes in the value of this adjusted bias as the gas composition dependent shifts of the $C_T(V)$ curves. For a noise free and lossless device the two methods should be equivalent, as they are both based on a measurement of a capacitance shift. However, due to the nonlinear nature of the $C_T(V)$ profile, and that DC current is drawn by the device differences between the two procedures should be considered.

Figure 8:
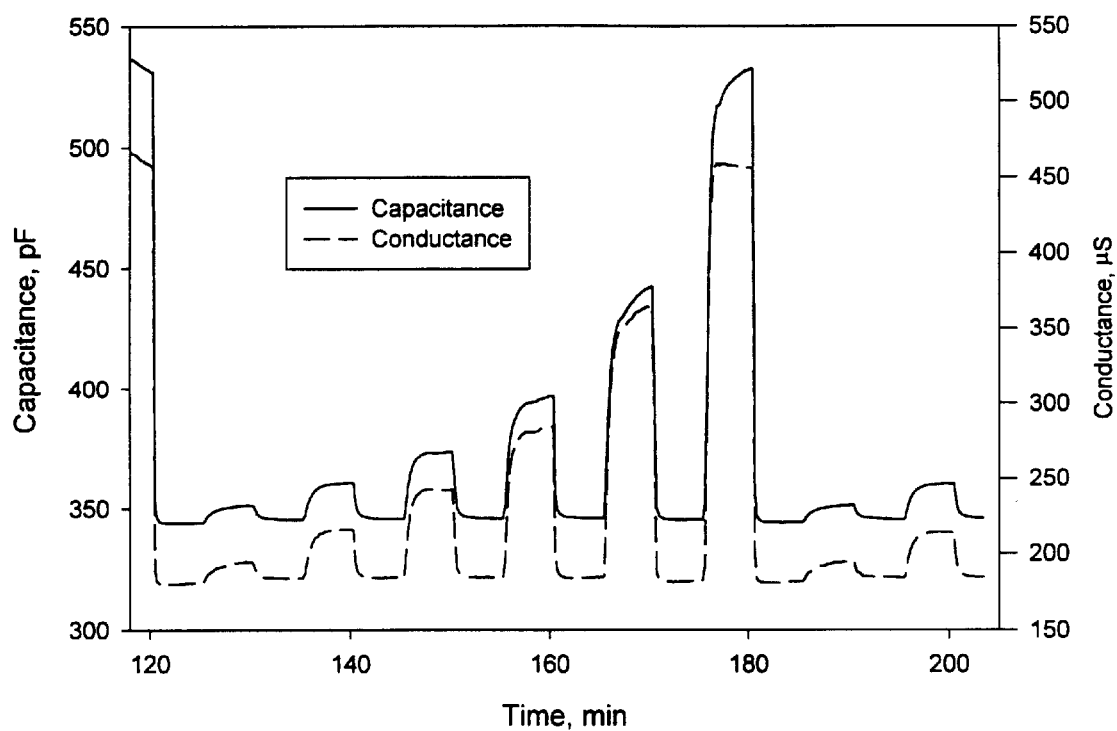
FIG. 8 is a graph illustrating the capacitance and conductance response of a laser ablated platinum gate MOS sensor device at a constant gate bias $V_g$=0.2V to rectangular pulses of variable height in propylene concentration. The pulse heights are varied monotonically from 0 to 120 ppm in steps of 20 ppm.
Figure 9:
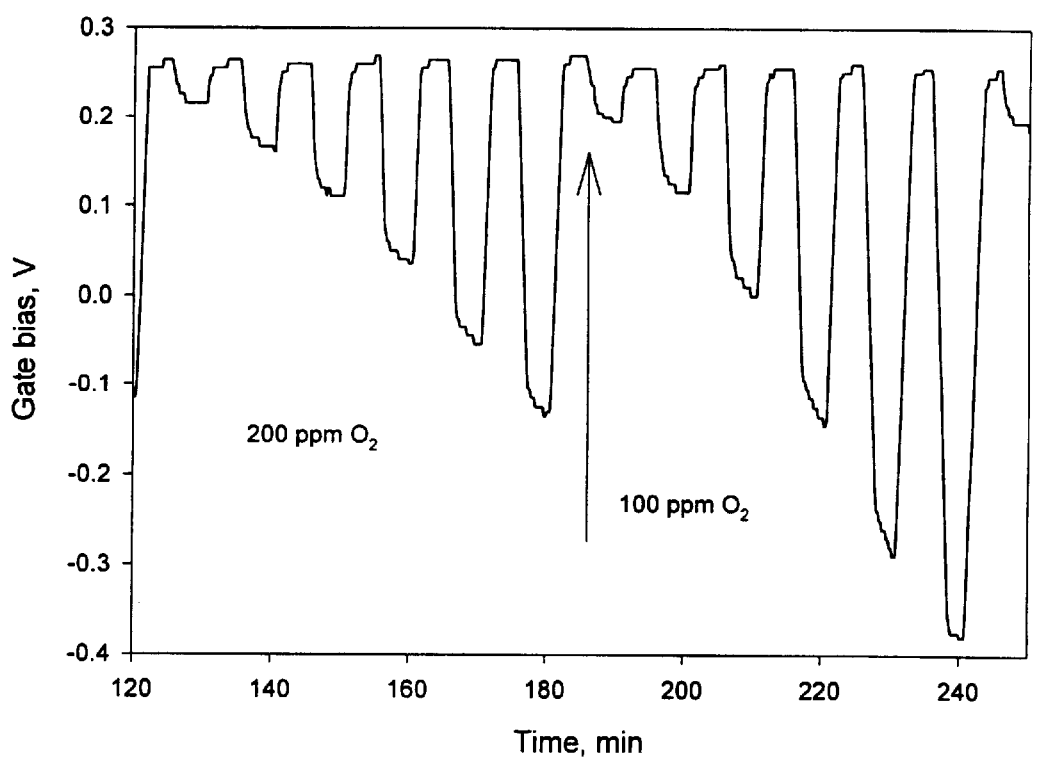
FIG. 9 is a graph illustrating the gate bias response in the constant capacitance (CT=390pF) feedback mode of the same laser ablated platinum gate MOS sensor device of FIG. 8 to the same sequence of propylene pulses, but at two different oxygen concentrations, 200 and 100 ppm.

FIGS. 8 and 9 show experimental response data for propylene, obtained by these two methods, using a device with a laser ablated Pt gate. FIG. 8 depicts the capacitance and conductance response of a laser ablated Pt metal gate at a constant gate bias $V_g=0.2V$ in rectangular pulses of variable heights in propylene concentration. The pulse heights were varied monotonically from 0 to 120 ppm in steps of 20 ppm. FIG. 9 illustrates a gate bias response in the constant capacitance (CT=390pF) feedback made of the same laser ablated Pt gate of FIG. 8 to the same sequence of propylene pulses but at oxygen concentration of 200 and 100 ppm.

Figure 10:
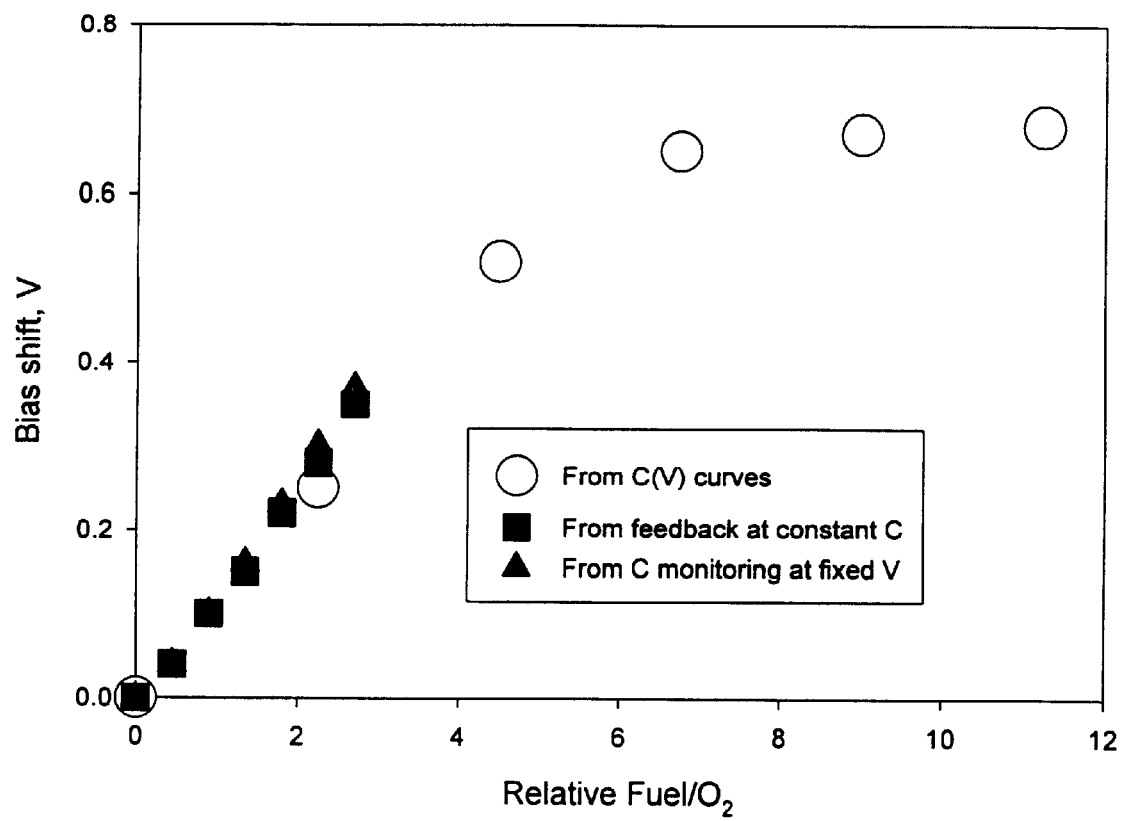
FIG. 10 is a graph illustrating the response to propylene of platinum ablated gate MOS sensors as a function of the combustible/oxygen concentration ratio normalized to stoichiometry.

By using the admittance profile in the absence of combustible FIG. 5, and the value of the bias at which the capacitance monitoring data of FIG. 8 were taken, one can obtain the (horizontal) bias shifts that would yield the capacitance values recorded at the different combustible concentrations. FIG. 10 shows the consistency in the comparison of the results obtained by the two methods. FIG. 10 depicts the response to propylene of platinum ablated gate MOS sensors as a function of the combustible/oxygen concentration ratio normalized to stoichiometry. It should be noted that the shift of the profiles with varying oxygen concentration, up to 500 ppm, in the absence of combustibles, is negligible when compared to those measured for the combustible concentration ranges considered in this paper. In FIG. 10, the abscissa is the combustible to oxygen ratio relative to its value at stoichiometry. The plot also shows the profile shifts measured directly from the data of FIG. 9 and it indicates that, at least for propylene alone, the sensor responds to the fuel/oxygen ratio, rather than to the absolute fuel concentration.

Figure 11:
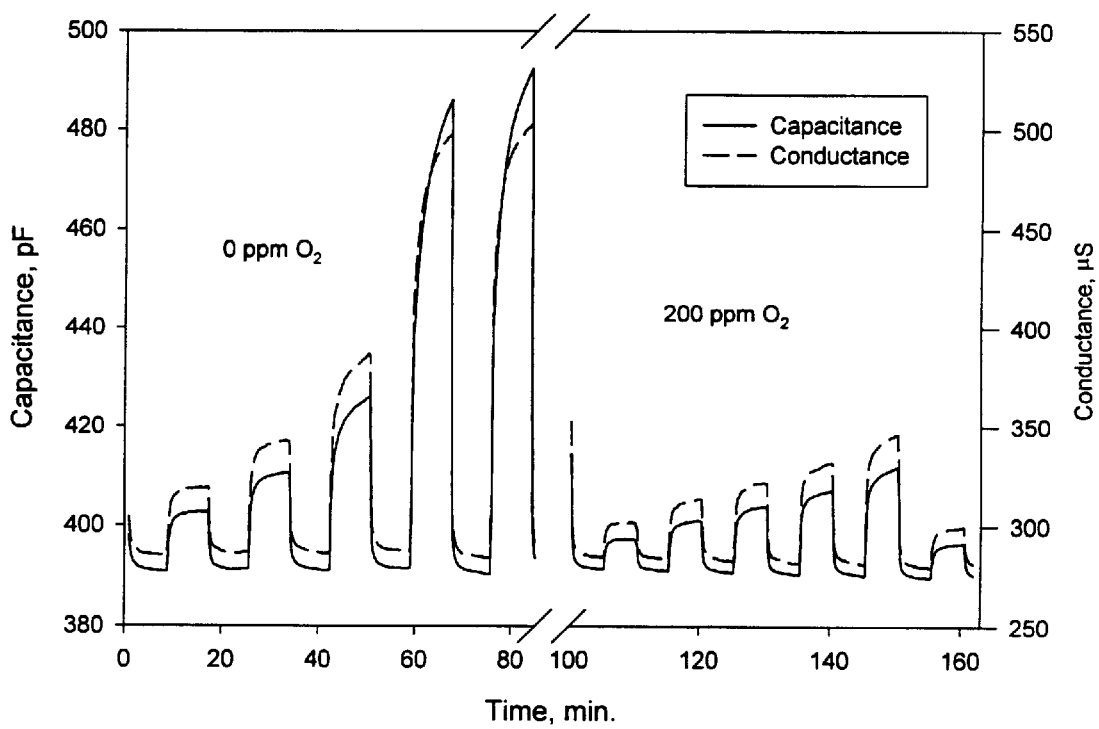
FIG. 11 is a graph illustrating the capacitance and conductance response of a laser ablated platinum gate MOS sensor device at a constant gate bias $V_g=0.2V$ to rectangular pulses of variable heights in CO concentration. The pulses heights are varied monotonically from 0 to 1000 ppm in steps of 200 ppm.
Figures 12, 14:
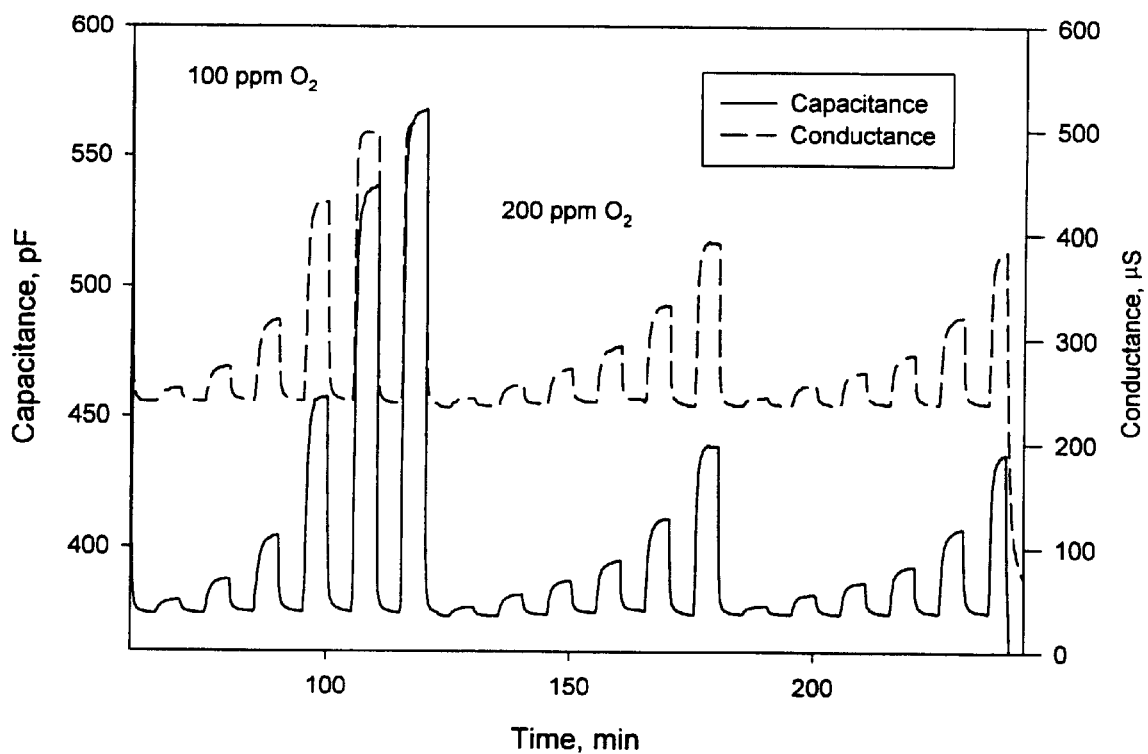
FIG. 12 is a graph illustrating the capacitance and conductance response of a laser ablated platinum gate MOS sensor at a constant gate bias $V_g=0.2V$ to rectangular pulses of variable heights and propane concentration. The pulses heights were varied monotonically from 0 to 120 ppm in steps of 20 ppm.

FIGS. 11 and 12 illustrate the capacitive response of this same type of device to CO and to a saturated hydrocarbon, propane. Again, it is clear from the data that the devices show response not only for the hydrocarbon, but also for CO.

Figure 13:
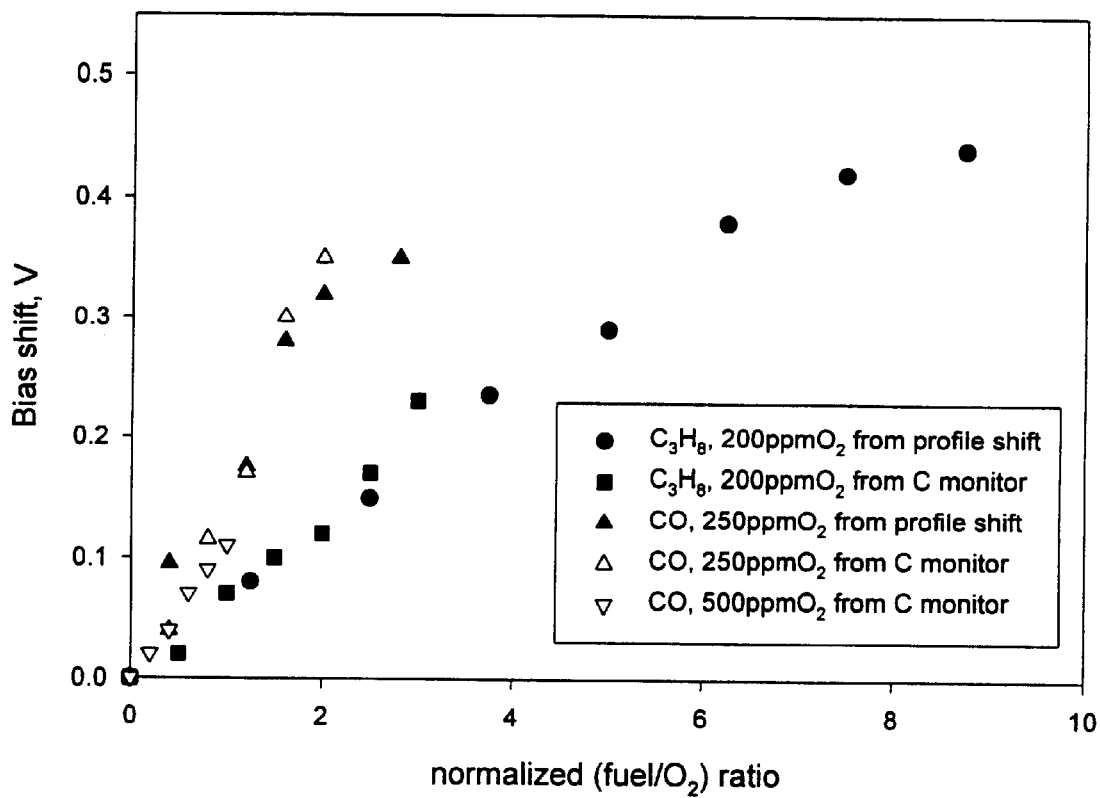
FIG. 13 is a graph illustrating the response to propane and CO of platinum ablated gate MOS sensor devices as a function of the combustible/oxygen concentration ratio normalized to stoichiometry.

As the effect of change in the combustible composition of the gas flow at the catalyst is mainly a shift in the flat band voltage of the device, it is reasonable to ascribe this shift, quite generally to charge concentration profile changes in the "insulator" layer of the capacitance $C_i$, which are induced by catalytic reaction adducts, products or intermediates that interact with the metal gate layer. If the $SiO_2$ were a perfect insulator, it would not allow charge motion and the charges at the gate or semiconductor interfaces, and the above relation would yield the voltage shift corresponding to a given change in the surface charge density. Under these conditions, the maximum charge, and therefore the maximum voltage shift that could be accommodated by the device would be determined by some type of break down process threshold. However, in part because of the high operating temperature, in part because of the poor (relative to oxide grown on Si) quality of the oxide on SiC, the insulator will accommodate a substantial density of mobile charges, whose concentration near the catalytic gate may well be modulated by the changes in surface chemistry, somewhat analogously to the zirconia Nernst cell. Then, at least in depletion, when there is no DC current, there would be a tendency for reversible saturation of the shift as this charge concentration increases. When this charge concentration reflects that of the combustible in the gas, a saturation effect would be observed for the response of the device. Such saturation is observed in the experimental data as illustrated in FIGS. 10 and 13.

The saturating voltage value seems to depend on the particular combustible species giving at least some hint of species specificity for this sensing mechanism. Such considerations serve as indications of possible mechanisms, but further detailed studies will be required for understanding of the charging processes. As for particular molecular species in the reacting flow that would be responsible for the induction of the charges, a specific model has been used to explain the hydrogen sensing process in Si based catalytic gate MOS devices.

Hydrogen sensitivity was first detected for Pd gates, where hydrogen dissociates on the surface in its atomic form easily penetrates through the relatively thin Pd film (100 nm). The extra charge in the insulator that would account for the voltage shift of the $C_T(V)$ curve might be the result of physical separation between the proton and the electron. The same mechanism might also explain the hydrogen sensitivity when Pt gates are used, as hydrogen dissociation probably also takes place on Pt, and there might be sufficient porosity in the thin gate films for transport of this species to the insulator. The hydrocarbon sensitivity of these devices can then be ascribed to hydrogen generated as an intermediary in its Pt catalyzed oxidation. There have been some arguments in the past, based on rather limited experimental evidence that have cast some doubt on this very simple hydrogen driven mechanism.

The fact that the present results, clearly show CO response comparable to that of hydrocarbons when normalized to carbon number shows that species other than hydrogen must also play an important role. In particular, the strong response to CO does suggest that oxygen, perhaps in terms of charged oxygen vacancies within the oxide might be involved in this chemically induced charging process.

In terms of the practical implementation of this type of sensor, it is important to note that in spite of the fact that there are substantial losses in the insulator, and that possibly the operational mechanism of this type of sensor hinges on the presence of mobile ionic charges within the insulator both being anathema to standard Si-based MOS technology, it is believed that the electrical characteristics of these devices at the operating temperatures are stable and quite reproducible from device to device, at least for the few tens of devices that were tested and prepared in the same manner. For the devices prepared with laser ablated contacts, the $C_T(V)$ profiles and sensor response could be recorded at frequencies even below 100 KHz, even as low as 10 KHz if the bias was kept within the depletion region, above the inversion range. Operation capability at such lower frequencies improves the attractiveness of such devices for onboard automotive application.

From the data on CO in FIG. 11 and, for example on $C_3H_8$. in FIG. 12, we can assess at least qualitatively a signal to noise ratio, and consequently give an estimate of the sensitivity that could be achieved with the present technology of these devices. With allowance for periodic baseline checking, i.e. measuring the output level for a fixed (perhaps 0.0) combustible concentration, and with proper adjustment of the oxygen concentration, a few ppm of $C_1$ (CO corresponds to $C_{0.5}$), could be detected The response time in this case, probably mainly by the flow system for relatively lean conditions is less than 1 minute.

Results have been presented on the response of SiC-based MOS structures to changes in the combustible concentration into which they have been immersed. Devices prepared in the Ford Research Laboratory involving a new technique for metal gate and metal back contact deposition, were extensively tested for electrical characteristics and for sensor response to a few combustibles, namely CO, propane, propylene. The results shows that for individual combustibles the response depends on the oxygen concentration, but it can be normalized in terms of the combustible to oxygen ratio. However, these normalized curves are different for the different combustibles indicating some chemical specificity in the sensing mechanism. The experimental data also indicate that, at least for individual combustibles, by appropriate adjustment of the $O_2$ concentration, even in their present rather primitive state of the art, the devices would be capable of detecting combustibles at the level of a few ppm $C_1$, with response time of less than one minute.

The new results about the sensitivity of these devices to CO also have implications in terms of the physical processes responsible for the gas sensing response, as the previously accepted mechanism in terms of hydrogen transport from the reacting mixture to the device interface needs to be generalized.

While the present invention has been described in detail in connection with the above examples, it is to be understood that such detail is solely for that purpose and that variations can be made by those skilled in the art without departing from the spirit of the invention.

What is claimed is:

1. A method of depositing a metal film onto a semiconductor substrate and an insulator layer of a MOS sensor to enhance its reliability and sensitivity to combustible gases, the method comprising the steps of:
   a) creating a high vacuum environment in a deposition chamber equipped with a window to allow a pulsed laser beam to enter the deposition chamber;
   b) adjusting the energy and focus of the pulsed laser beam at a first target, and the separation between the first target and the substrate to obtain a metal film having a desired roughness, wherein the first target is selected from the group consisting of tantalum, nickel, platinum and titanium;
   c) adjusting the pulse repetition rate and the deposition time of the laser beam based on the desired roughness, to obtain a metal film having a desired thickness;
   d) depositing a metal film directly onto the semiconductor substrate of the sensor by laser ablation of the first target to create a metal back contact;
   e) rotating the semiconductor substrate to permit deposition onto the insulator layer;
   f) exchanging the first target with a second target, wherein the second target is a catalytically active metal selected from the group consisting of platinum, palladium, rhodium and alloys thereof; and
   g) depositing a metal film onto the insulator layer by laser ablation of the second target to create a metal gate directly on the insulator layer.

2. The method of claim 1, further comprising the step of cleaning the semiconductor substrate with acetone and methanol.

3. The method of claim 1, further comprising the step of cleaning the first target with the laser beam.

4. The method of claim 1, wherein the laser beam is adjusted to a fluence of $2J/cm^2$ and a repetition rate of 20 Hz.

5. The method of claim 1, wherein the first target comprises multiple targets to deposit a multi-layer film.

6. The method of claim 5, further comprising the step of exchanging targets to deposit a multi-layer film.

7. The method of claim 1, wherein the first target is a multi-target, comprised of tantalum and platinum.

8. The method of claim 1, further comprising the step of selecting the first target to correspond with the metal film desired for deposition onto the semiconductor substrate.

9. The method of claim 1, further comprising the step of selecting the second target to correspond with the metal film desired for deposition onto the insulator layer.

10. The method of claim 1, wherein the desired thickness of the metal film is approximately 1000 Angstroms.

11. The method of claim 1, wherein the deposition is achieved without the use of a heater.

12. The method of claim 1, wherein the energy of the pulsed laser beam ranges from 10 to 100 ev.

13. The method of claim 1, wherein the pulsed laser beam is created by an excimer laser.

14. The method of claim 1, further comprising the step of depositing the film through a shadow mask interposed between the target and the substrate.

15. The method of claim 1, wherein the step of rotating the semiconductor substrate is achieved by rotating an arm of a rotatable substrate holder.

16. The method of claim 1, further comprising the step of adjusting the separation between the first target and the semiconductor substrate such that the separation is smaller than the mean free path of the atomic species transferred from the first target to the semiconductor substrate.

17. A method of depositing a metal film onto a semiconductor substrate and an insulator layer of a MOS sensor to enhance its reliability and sensitivity to carbon monoxide, the method comprising the steps of:
   a) creating a high vacuum environment in a deposition chamber equipped with a window to allow a pulsed laser beam to enter the deposition chamber;
   b) adjusting the energy and focus of the pulsed laser beam at a first target, and the separation between the first target and the substrate to obtain a metal film having a desired roughness;
   c) adjusting the pulse repetition rate and the deposition time of the laser beam based on the desired roughness, to obtain a metal film having a desired thickness;
   d) depositing a metal film directly onto the semiconductor substrate of the sensor by laser ablation of the first target to create a metal back contact;
   e) rotating the semiconductor substrate to permit deposition onto the insulator layer;
   f) selecting a desired metal for deposition of the film onto the insulator layer to adjust the sensor's sensitivity towards carbon monoxide;
   g) exchanging the first target with a second target to correspond with the metal film desired for deposition onto the insulator layer; and
   h) depositing a metal film onto the insulator layer by laser ablation of the second target to create a metal gate directly on the insulator layer.

* * * * *